(12) United States Patent
Billsberry

(10) Patent No.: US 6,734,726 B2
(45) Date of Patent: May 11, 2004

(54) BALANCED DISTORTION REDUCTION CIRCUIT

(75) Inventor: Mark Billsberry, Melbourne Beach, FL (US)

(73) Assignee: Remec, Inc., Del Mar, CA (US)

( * ) Notice: Subject to any disclaimer, the term of this patent is extended or adjusted under 35 U.S.C. 154(b) by 126 days.

(21) Appl. No.: 10/187,177

(22) Filed: Jun. 27, 2002

(65) Prior Publication Data
US 2003/0001669 A1 Jan. 2, 2003

Related U.S. Application Data
(60) Provisional application No. 60/301,927, filed on Jun. 29, 2001.

(51) Int. Cl.[7] .............................. H03F 3/66; H03F 1/26
(52) U.S. Cl. ......................................... 330/52; 330/149
(58) Field of Search ........................... 330/52, 149, 151

(56) References Cited

U.S. PATENT DOCUMENTS

| | | | |
|---|---|---|---|
| 4,352,072 A | 9/1982 | Harrington | 330/149 |
| 4,389,618 A | 6/1983 | Bauman | 330/149 |
| 4,394,624 A | 7/1983 | Bauman | 330/151 |
| 4,580,105 A | 4/1986 | Myer | 330/149 |
| 4,879,519 A | * 11/1989 | Myer | 330/149 |
| 4,885,551 A | 12/1989 | Myer | 330/52 |
| 5,077,532 A | 12/1991 | Obermann et al. | 330/151 |
| 5,148,117 A | 9/1992 | Talwar | 330/149 |
| 5,155,448 A | 10/1992 | Powell | 330/149 |
| 5,166,634 A | 11/1992 | Narahashi et al. | 330/151 |
| 5,307,022 A | 4/1994 | Tattersall, Jr. et al. | 330/52 |
| 5,323,119 A | 6/1994 | Powell et al. | 330/151 |
| 5,327,096 A | 7/1994 | Sakamoto et al. | 330/151 |
| 5,386,198 A | 1/1995 | Ripstrand et al. | 330/52 |
| 5,455,537 A | 10/1995 | Larkin et al. | 330/52 |
| 5,489,875 A | 2/1996 | Carvers | 330/151 |
| 5,491,454 A | 2/1996 | Matz | 330/149 |
| 5,576,659 A | 11/1996 | Kenington et al. | 330/52 |

(List continued on next page.)

FOREIGN PATENT DOCUMENTS

| | | | |
|---|---|---|---|
| EP | 0367458 A2 B1 | 10/1989 | H03F/1/32 |
| EP | 0466123 A1 | 7/1991 | H03F/1/32 |
| EP | 0758163 A1 | 7/1996 | H03F/1/32 |
| WO | 9728598 A1 | 8/1997 | H03F/1/32 |
| WO | 9737427 A1 | 10/1997 | H03F/1/32 |
| WO | 9804034 A1 | 1/1998 | H03F/1/32 |
| WO | 0030248 A1 | 5/2000 | H03F/1/26 |
| WO | 0106640 A1 | 1/2001 | H03F/1/26 |

OTHER PUBLICATIONS

Gupta, K.C., "Computer–Aided Design of Microwave Circuits", Dedham, Mass: Artech, 1981, pp. 544–547.

Rey, C.G. and E. Clark, "Linearization Performance for a Polar Work Function Predistorter", Proceedings RAWCON '98, 1998 IEEE Radio and Wireless Conference, Colorado Springs, CO USA, Aug. 9–12, 1998., pp. 325–328.

Webb et al. "Linearisation by Predistortion", Chapter 4.5.2 of Modern Quadrature Amplitude Modulation: Principles and Applications for Fixed and Wireless Communications, New York: IEEE Press, 1994, pp. 128–139.

Primary Examiner—Patricia Nguyen
(74) Attorney, Agent, or Firm—Heller Ehrman White & McAuliffe LLP

(57) ABSTRACT

A method and apparatus for utilizing the distortion generated within a portion of a balanced amplifier to cancel the distortion generated within the whole balanced amplifier. Samples of the signal and distortion from part of the balanced amplifier are combined with a reference signal such that the two signals destructively combine leaving the distortion from the sampled part of the balanced amplifier. The gain and phase of the distortion is then adjusted so that when it is coupled into the input of the other part of the balanced amplifier the distortion generated by both parts of the balanced amplifier are cancelled.

23 Claims, 4 Drawing Sheets

U.S. PATENT DOCUMENTS

| | | |
|---|---|---|
| 5,617,061 A | 4/1997 | Fukuchi .................... 330/151 |
| 5,619,168 A | 4/1997 | Myer ........................ 330/149 |
| 5,742,201 A | 4/1998 | Eisenberg et al. ............ 330/2 |
| 5,760,646 A | 6/1998 | Belcher et al. ............ 330/149 |
| 5,770,971 A | 6/1998 | McNicol ..................... 330/52 |
| 5,808,512 A | 9/1998 | Bainvoll et al. ........... 330/151 |
| 5,892,397 A | 4/1999 | Belcher et al. ............ 330/149 |
| 5,986,499 A | 11/1999 | Myer ........................ 330/52 |
| 5,999,048 A | 12/1999 | Zhou ........................ 330/52 |
| 6,029,285 A | 2/2000 | Belcher et al. ............ 330/149 |
| 6,037,837 A * | 3/2000 | Miyaji et al. .............. 330/149 |
| 6,078,216 A | 6/2000 | Proctor, Jr. ................. 330/151 |
| 6,091,297 A | 7/2000 | Bar-David et al. .......... 330/149 |
| 6,157,254 A | 12/2000 | Myer ........................ 330/52 |
| 6,188,732 B1 | 2/2001 | Rha ......................... 375/297 |
| 6,259,319 B1 | 7/2001 | Ghanadan et al. .......... 330/151 |
| 6,275,105 B1 | 8/2001 | Ghannouchi et al. ....... 330/151 |
| 6,285,252 B1 * | 9/2001 | Huang ....................... 330/149 |
| 6,515,544 B1 * | 2/2003 | Suzuki et al. .............. 330/151 |

* cited by examiner

BALANCED DISTORTION REDUCTION CIRCUIT

REFERENCE TO PRIORITY DOCUMENT

This application claims priority of co-pending U.S. Provisional Patent Application Serial No. 60/301,927 entitled "Balanced Distortion Reduction Circuit" by Mark Billsberry, filed Jun. 29, 2001. Priority of the filing date of Jun. 29, 2001 is hereby claimed, and the disclosure of the Provisional Patent Application is hereby incorporated by reference.

BACKGROUND OF THE INVENTION

1. Field of the Invention

The invention relates generally to radio frequency amplifiers, and more particularly, to reducing the distortion from a balanced radio frequency power amplifier.

2. Description of the Related Art

Radio frequency (RF) amplifiers are used in a wide variety of applications, including communications. Ideally the transfer function of an RF amplifier is linear, with the output of the amplifier being an amplified replica of the input to the amplifier. However, conventional RF amplifiers typically have some degree of non-linearity in their transfer function, particularly at high power levels such that different signal frequencies will be amplified by different amounts. This non-linearity in an RF amplifier produces distortion in the RF amplifier output.

Distortion in the RF amplifier output can reach levels that are unacceptable. For example, to meet the requirements of many CDMA modulation standards, power amplifier outputs need to exhibit very low distortion. If some type of linearization or distortion reduction technique is not used, the RF amplifier can have poor efficiency or require high cost components.

Many distortion reduction techniques use a distortion generator to cancel the distortion generated within a main RF power amplifier. These techniques generally assume that the low power distortion generator has a non-linear transfer function that is either similar to, or opposite from, the non-linear transfer function of the main RF amplifier. The output of the distortion generator, which exhibits the non-linear transfer function, is sampled and used to generate a signal that is combined with the output of the main RF power amplifier in an attempt to cancel the distortion present in the RF amplifier output. A drawback to this technique is that, for the signal combining to result in cancellation the non-linear transfer function of the distortion generator must match the non-linear transfer function of the main RF amplifier. This match can be difficult to achieve.

Another distortion reduction technique, the feedforward technique, overcomes the difficulty in providing a distortion generator that has a non-linear transfer function that matches the main RF amplifier. Rather, the feedforward technique samples the main RF amplifier output, which includes both the desired transmitted signal and amplifier induced distortion. The sampled output of the main RF amplifier is then combined with a sample of the amplifier input signal such that the two sampled signals destructively combine, leaving only the distortion from the main amplifier. The resulting distortion signal is then amplified using an error amplifier and is added at the output of the main RF amplifier with the gain and phase adjusted such that the error amplifier output destructively combines with the main RF amplifier output and cancels the amplifier induced distortion present in the output of the main RF amplifier. A drawback to the feedforward distortion reduction technique is that the power handling capability required of the error amplifier is based on the magnitude of the distortion. The feedforward technique can provide good performance when improving the linearity of low distortion amplifiers, however, when this technique is applied to an amplifier that is operating close to its compression point, the error amplifier power requirement may become excessively large, making this technique impractical and unsatisfactory for many applications.

From the discussion above, it should be apparent that there is a need for a system that can provide linearization of an amplifier throughout its operating range, for example when it is operating close to its compression point, without requiring excessively large error amplifier power levels.

SUMMARY

A method and apparatus for reducing distortion in the output of a balanced RF power amplifier samples the distortion of the main RF power amplifier output and also reduces the power handling capability required for the error amplifier. A circuit that can provide these features measures the difference between the output from one portion of the balanced RF power amplifier and a sample of the amplifier input. This difference signal, which represents the amplifier distortion, can then be combined at the input to another portion of the balanced RF power amplifier. The amplitude and phase of the difference signal can be adjusted such that the distortion produced from the respective portions of the balanced RF amplifier are cancelled when the respective outputs are combined to produce the balanced RF amplifier output. Because the distortion generated in each portion of the balanced RF power amplifier should be similar, the distortion in one portion of the RF power amplifier is used to minimize the distortion in other portions of the RF power amplifier. In addition, this technique uses one portion of the balanced RF amplifier to amplify the difference signal to the desired level and thereby does not require a powerful error amplifier. Also, because the difference signal is injected into the input signal in front of the power amplifier, this technique does not require additional couplers following the main RF power amplifier output. The elimination of additional couplers after the main RF power amplifier can result in a lower cost design that provides improved efficiency.

In another aspect, the main RF power amplifier can include multiple amplifying devices that produce a combined output signal. The distortion produced in one of the amplifying devices can be sampled and used to cancel the distortion from all of the multiple amplifying devices to minimize the distortion in the main In yet another aspect, a tone, or pilot signal, can be injected into the termination port of a balanced amplifier input splitter. The amplitude of the tone or pilot signal that is present in a balanced RF amplifier output combiner termination port can be detected and used as an input to an adaptation loop to minimize the tone, or pilot signal present in the output combiner termination port. By injecting the tone or pilot signal in the splitter termination port, the tone is isolated from the output of the balanced amplifier.

Other features and advantages of the present invention should be apparent from the following description of the preferred embodiment, which illustrates, by way of example, principles of the invention.

DETAILED DESCRIPTION

Figure 1:
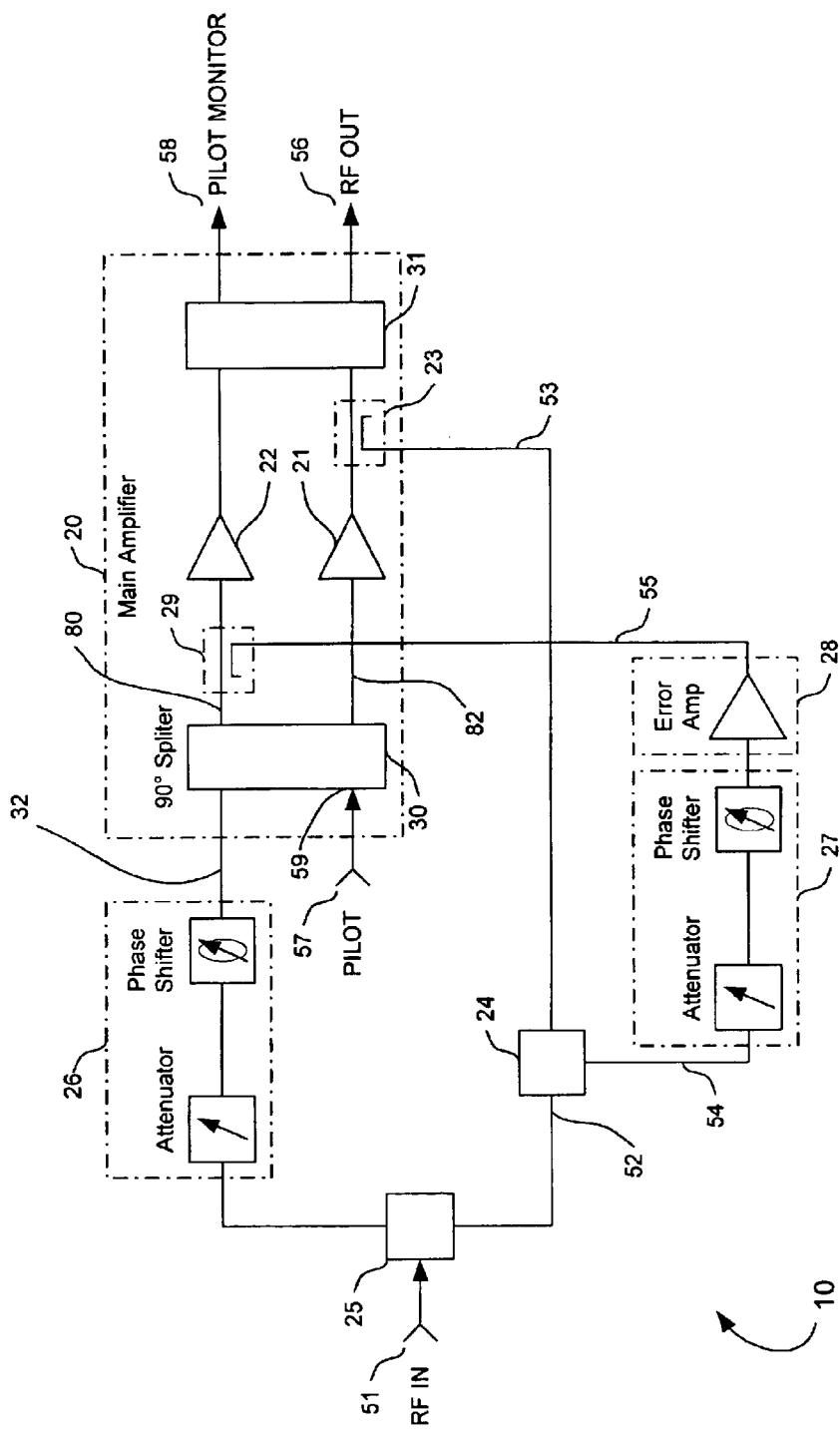
FIG. 1 is a block diagram illustrating a balanced distortion reduction circuit.

FIG. 1 is a block diagram illustrating a balanced distortion reduction circuit 10 for reducing the distortion from a balanced RF main power amplifier 20 by sampling the output of the main amplifier with reduced power handling requirements for an error amplifier.

An RF input signal 51 is introduced into the circuit 10 through an RF splitter 25. The RF splitter 25 directs a portion of the input signal to a input phase shifter and attenuator 26. The input splitter also directs a portion of the input signal to a distortion phase shifter and attenuator 27.

The output 32 of the input phase shifter and attenuator 26 is routed to the main amplifier 20. The main amplifier 20 includes an input splitter 30 that is configured to receive the output of the input phase shifter and attenuator 26, divide the received signal to produce two splitter output signals 80, 82, and provide one of the output signals 80, 82 into each of two balanced amplifying devices in the main amplifier 20. For example, in FIG. 1 there are two balanced amplifying devices, a first amplifier 21 and a second amplifier 22 within the main amplifier 20. In the FIG. 1 embodiment, the input splitter 30 divides the received attenuator/phase shifter signal 32 in half and provides equal-strength signals to the first and second amplifying devices 21, 22. Alternatively, the input splitter 30 can divide the signal 32 into signals of different strengths and can apply the different strength signals to the first and second amplifying devices 21, 22.

In FIG. 1, the output of the first amplifying device 21 is sampled using a sampling coupler 23. The output of the sampling coupler 23 is a sampled signal 53, which includes the distortion introduced by the first amplifying device 21. The sampled signal 53 is then combined with a sample of the split RF input signal 52 in a distortion combiner 24. The input signal 52 is received at the combiner 24 from the RF splitter 25. The input phase shifter and attenuator 26 is controlled such that the gain and phase of the sampled output signal 53 will combine destructively with the sampled input signal 52, leaving only a difference, or distortion signal 54 output from the distortion combiner 24. Those of skill in the art will understand how to control the input phase shifter and attenuator 26 so as to achieve the desired effect recited herein. The distortion signal 54 from the combiner 24 is then applied to a distortion phase shifter and attenuator 27. Depending on the distribution of gain within the main amplifier 20, a low power error amplifier 28 might be useful to adjust the distortion signal 55 to a desired level. The output of the attenuator and phase shifter 27 and of the optional error amplifier 28 provides an adjusted distortion signal 55.

The adjusted distortion signal 55 is then applied to a distortion combiner 29 in front of the second amplifying device 22. The distortion combiner 29 combines the output signal 80 received from the input splitter 30 and the adjusted distortion signal 55 and outputs a combined signal into the second amplifying device 22. The gain and phase of the distortion phase shifter and attenuator 27 are adjusted to give maximum cancellation of the distortion in the signal at the output 56 of the balanced main amplifier output 20. Techniques for adjusting the gain and phase of the input phase shifter and attenuator 26 and the distortion phase shifter and attenuator 27 are well known to those skilled in the art, who will be able to select a suitable technique to accommodate various design considerations.

In another embodiment, an optional tone or pilot signal 57 can be injected into a termination port 59 of the balanced amplifier input splitter 30 to key a reduction in output distortion. The distortion phase shifter and attenuator 27 can be adjusted until the detected tone or pilot signal produced from the balanced amplifier output combiner 31 termination port 58 is minimized. In this arrangement, the injected pilot signal 57 is isolated from the amplifier output. The pilot signal can be a single frequency. In other embodiments, the pilot signal 57 might take other forms, for example, a noise signal, a Code Division Multiple Access (CDMA) signal, or multiple desired frequencies, or a single frequency that changes or hops.

Figure 2:
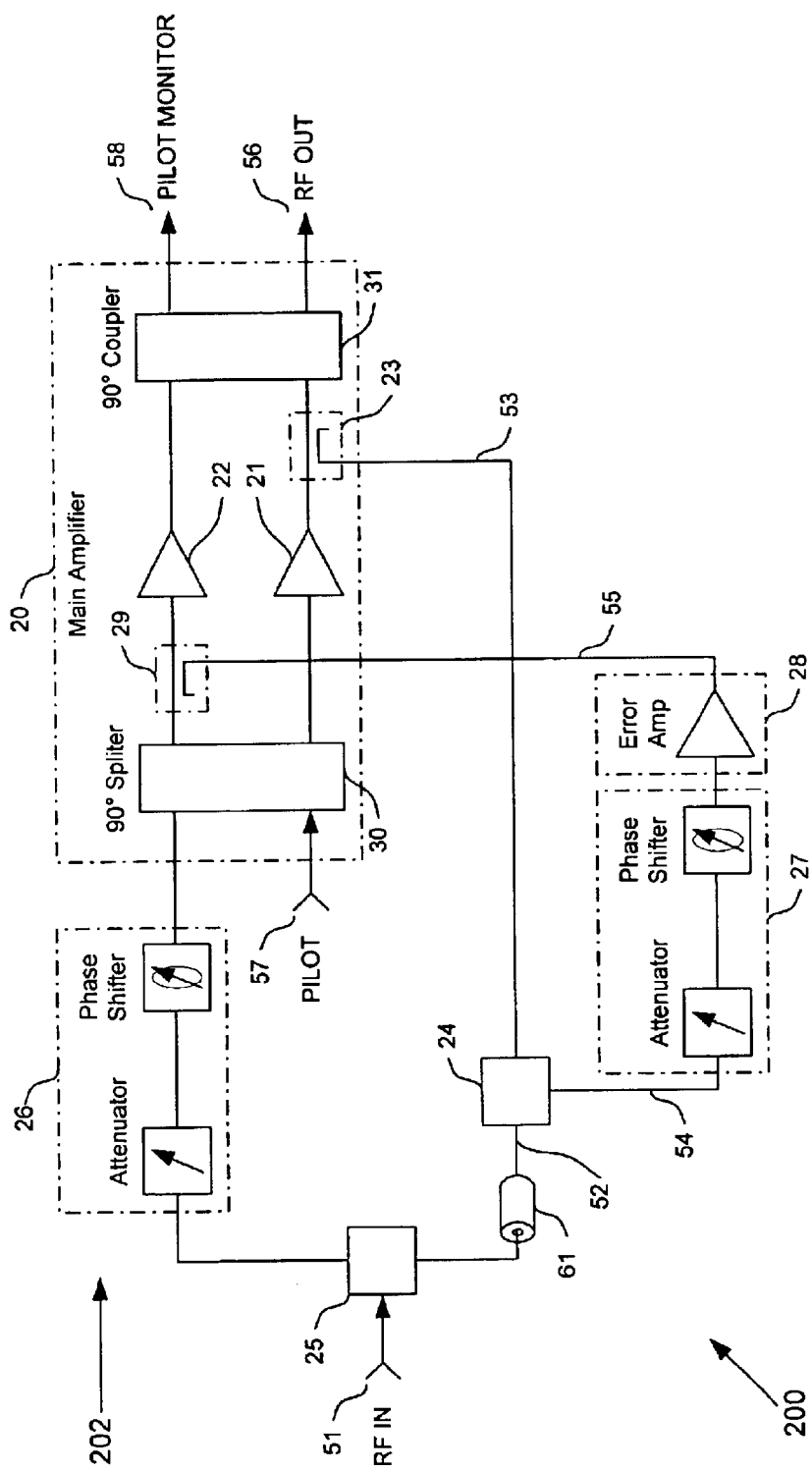
FIG. 2 is a block diagram illustrating a balanced distortion circuit that includes a delay matched first loop.

FIG. 2 is a block diagram illustrating a balanced distortion circuit 200 that includes a delay matched first loop 202. In all the drawings, like reference numerals refer to like items, so it should be apparent that the circuit of FIG. 2 has some elements in common with the circuit of FIG. 1. In FIG. 2, however, a delay line 61 in front of the combiner 24 is used to match the delay of the sampled input signal 52 coming from the RF splitter 25 and the sampled power amplifier output signal 53. The use of the delay line 61 improves the signal cancellation in the first loop 202 over a wider bandwidth.

Figure 3:
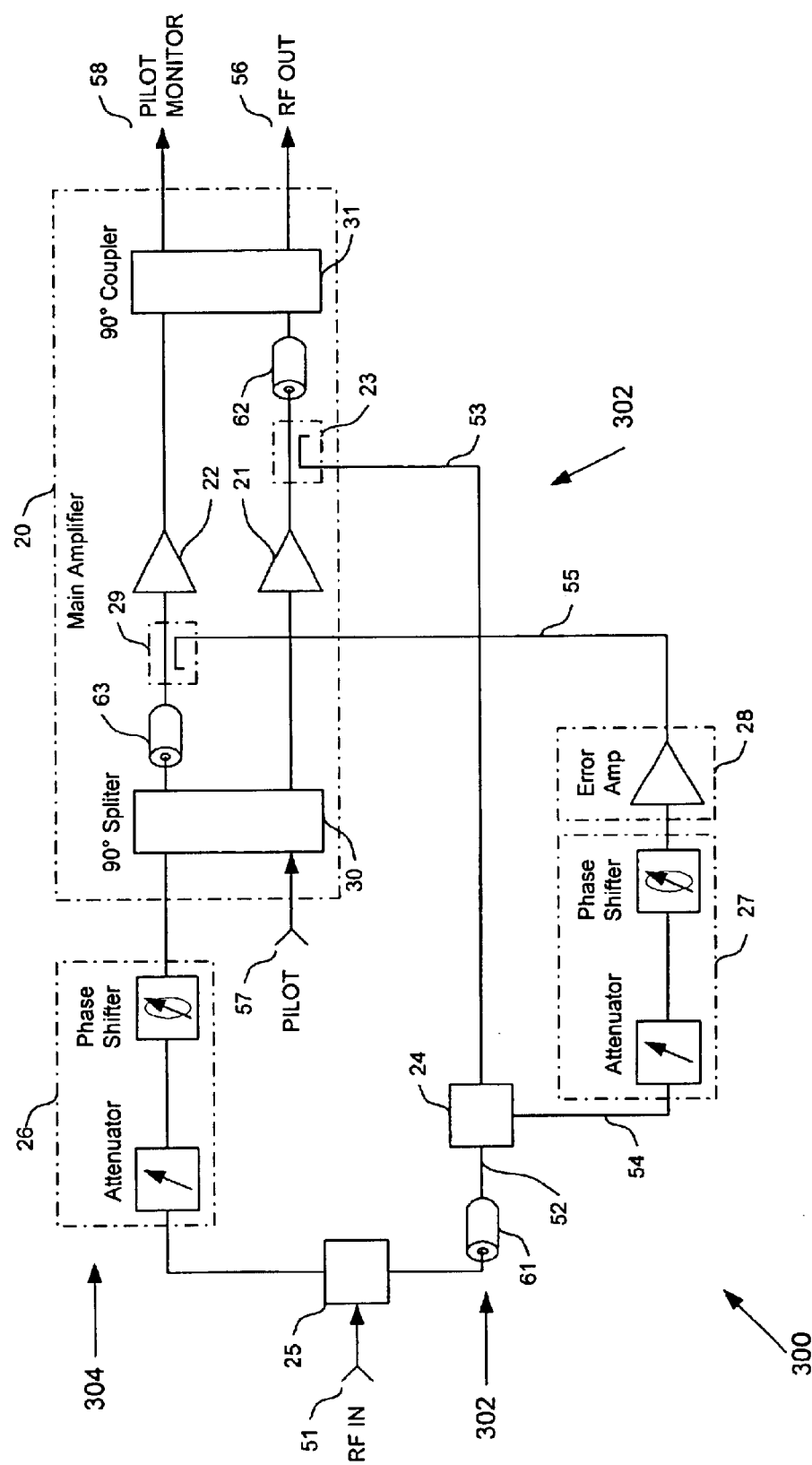
FIG. 3 is a block diagram illustrating a balanced distortion reduction circuit that includes a delayed matched second loop.

FIG. 3 is a block diagram illustrating a balanced distortion reduction circuit 300 that includes a delayed matched second loop 302 and a delayed matched first loop 304. In FIG. 3, a delay line 63 is included in front of the second amplifying device 22 of the main amplifier 20, and thereby enables the cancellation in the second loop 302 to be effective over a wider bandwidth. The addition of the delay line 62 following the first amplifying device 21 of the main amplifier 20 and in front of the output coupler 31 maintains the delay match between the two amplifying devices 21, 22 of the main amplifier 20.

Figure 4:
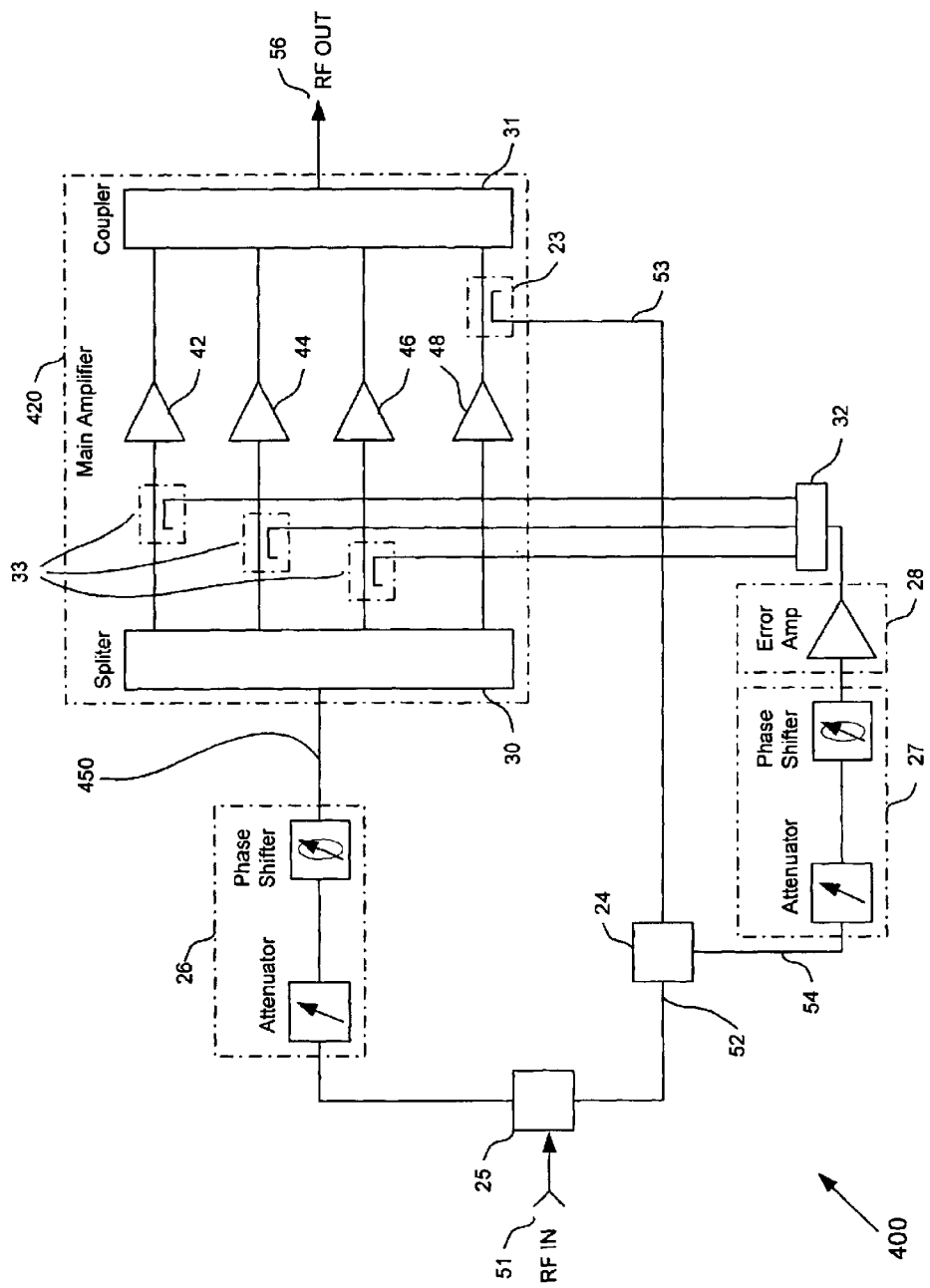
FIG. 4 is a block diagram that illustrates a balanced reduction circuit applied to an N-way combined amplifier.

FIG. 4 is a block diagram that illustrates a balanced reduction circuit 400 applied to an N-way combined main RF amplifier. In this embodiment, the technique described above can be used in an amplifier that has more than two amplifying devices in the main RF power amplifier. For example, FIG. 4 illustrates the application of this technique to a main RF power amplifier 420 with four power amplifying devices, including a first amplifying device 48, and second through fourth amplifying devices 42, 44, 46, respectively. As before, the input phase shifter and attenuator 26 is controlled such that the gain and phase of the sampled output signal 53 will combine destructively with the sampled input signal 52 in the distortion combiner 24, leaving only a difference, or distortion signal 54 output from the distortion combiner. In the FIG. 4 embodiment, the output of the error amplifier 28 comprising the adjusted distortion signal is routed to an error signal splitter 32 that divides the error signal output so as to apply the appropriate error signal to a respective distortion combiner 33 located at the input to each of the remaining amplifying devices 42, 44, 46.

The main amplifier input splitter 30 divides the signal 450 from the attenuator and phase shifter 26 into N signals of equal strength to be applied to each of the N power amplifying devices 42, 44, 46, 48, and the error signal splitter 32 divides the error signal output from the error amplifier 28 into equal strength portions to be applied to the input of each distortion combiner 33. In other embodiments, the input splitter 30 can divide the input signal 450 into signals of different strengths to be sent to the amplifying devices 42, 44, 46 whose output is not sampled by the sampling coupler 23, and the error signal splitter 32 can divide the error signal into appropriate signal strengths to correspond to the respective input signal strengths to be applied to the remaining amplifying devices 42, 44, 46. Thus, the error splitter 32 will apportion the error signal according to the gains of the amplifying devices 42, 44, 46 and the magnitudes of the signals they will receive from the input splitter 30. In this way, cancellation of distortion in the signal at the combined RF output 56 of the balanced main amplifier 20 is achieved.

The foregoing description details certain embodiments of a circuit constructed in accordance with the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come with the meaning and range of equivalency of the claims are to be embraced within their scope.

I claim:

1. A balanced amplifier distortion reduction circuit comprising:
   an input phase shifter and attenuator configured to receive an amplifier input signal and to output a phase shifter and attenuator signal;
   a main amplifier that includes a plurality of amplifying devices, an input splitter, and an output combiner, the splitter configured to receive the phase shifter and attenuator signal and to route a portion of the signal to each amplifying device wherein each amplifying device is configured to receive a portion of the phase shifter and attenuator signal and to output an amplified replica of the portion of the signal into the output combiner, the output combiner configured to combine the outputs of the plurality of amplifying devices and to output a main amplifier output;
   a sampling coupler connected to the output of a selected one of the amplifying devices, the sampling coupler configured to receive the output of the amplifying device and to extract a sample of the received output of the amplifying device; and
   a distortion coupler connected to an input of a second one of the amplifying devices, the distortion coupler configured to receive the respective portion of the input signal for the second amplifying device and an adjusted distortion signal, and to combine the received input and distortion signals and to output a combined signal into the input of the second amplifying device.

2. A balanced amplifier as defined in claim 1, further comprising:
   a distortion combiner configured to receive the extracted sample of the output signal of the selected amplifying device and a sample of the input signal and to output a distortion signal that is the difference between the sample of the selected amplifying device and the sample of the input signal;
   a distortion phase shifter and attenuator configured to receive the distortion signal and to adjust the phase and amplitude of the distortion signal to desired levels and to output an adjusted distortion signal.

3. A balanced amplifier as defined in claim 2, further including a low power error amplifier that amplifies the adjusted distortion signal.

4. A balanced amplifier as defined in claim 2, wherein the adjusted distortion signal is adjusted such that distortion in the main amplifier output signal is reduced.

5. A balanced amplifier as defined in claim 1, further comprising a delay element inserted in front of the distortion combiner.

6. A balanced amplifier as defined in claim 5, wherein the delay element is configured to match the delay of the amplifier input signal and the sample extracted from the sampling coupler.

7. A balanced amplifier as defined in claim 1, further comprising a delay element inserted between the input splitter and the distortion coupler in front of the second one of the amplifying devices.

8. A balanced amplifier as defined in claim 7, wherein the delay element is configured to match the delay of the adjusted distortion signal and the portion of input signal from the splitter.

9. A balanced amplifier as defined in claim 7, further comprising a delay element inserted between the output of the first amplifying device and the output combiner.

10. A balanced amplifier as defined in claim 9, wherein the delay element is configured to match the delay from the input splitter, through the amplifying devices and out of the output combiner.

11. A distributed amplifier distortion reduction circuit comprising:
    an input phase shifter and attenuator means for receiving an input signal and outputting an amplifier input signal;
    main amplifying means, including a plurality of amplifying devices, an input splitter means, and an output combiner means, for receiving the amplifier input signal at the splitter means and routing a portion of the input signal to each amplifying device, wherein each amplifying device receives a portion of the input signal and outputs an amplified replica of the portion of the input signal into the output combiner means, the output combiner means combining the outputs of the plurality of amplifying devices and outputting a main amplifier output;
    sampling coupler means for extracting a sample of the output of a selected one or more of the amplifying devices; and
    distortion coupler means, connected to an input of one or more of the amplifying devices that do not have a sampling coupler on their output, for receiving the respective portion of the input signal for the second amplifying device and an adjusted distortion signal, combining the received input and distortion signals, and outputting a combined signal into the input of the second amplifying device.

12. A distributed amplifier as defined in claim 11, further comprising:
    distortion combiner means for receiving the extracted sample of the output signal of the selected amplifying device and a sample of the input signal and outputting a distortion signal that is the difference between the sample of the selected amplifying device and the sample of the input signal; and
    distortion phase shifter and attenuator means for receiving the distortion signal and adjusting the phase and amplitude of the distortion signal to desired levels and outputting an adjusted distortion signal.

13. A distributed amplifier as defined in claim 12, wherein the distortion phase shifter and attenuator means includes a low power error amplifier that amplifies the adjusted distortion signal.

14. A distributed amplifier as defined in claim 11, further comprising a phase shifter and attenuator means, and en error amplifier means, between the sampling combiner means and the distortion coupler means.

15. A distributed amplifier as defined in claim 14, wherein the phase shifter and attenuator means and error amplifier means reduce the distortion in the main amplifier output.

16. A balanced amplifier distortion reduction circuit comprising:

an input phase shifter and attenuator configured to receive an input signal and to output an amplifier input signal;

a main amplifier that includes an input splitter and a first and a second amplifying device, the input splitter configured to receive the amplifier input signal and a pilot signal and to output a signal to each amplifying device, each amplifying device configured to receive an input signal and pilot signal from the splitter and to output an amplified version of the input signal;

a sampling coupler connected to the output of the first amplifying device, the sampling coupler configured to receive the output of the first amplifying device and to extract a sample of the output of the fist amplifying device;

a distortion combiner configured to receive the sample of the output of the first amplifying device and a sample of the input signal and to output a distortion signal that is the difference between the sample of the first amplifying device and the sample of the input signal; and a distortion coupler connected to the input of the second amplifying device, the distortion coupler configured to receive a portion of the input signal and the distortion signal and to combine the input and distortion signals and to output a combined signal into the input of the second amplifying device such that the distortion generated by the second amplifying device cancels the distortion generated within each of the first and second amplifying devices when the output of the first and second amplifying devices are combined in an output combiner, wherein the output combiner is configured to combine the outputs of the first and second amplifying devices and to output an amplified signal and an amplified pilot signal.

17. A balanced amplifier as defined in claim 16, further comprising a distortion phase shifter and attenuator and an error amplifier connected between the distortion combiner and the distortion coupler.

18. A balanced amplifier as defined in claim 17, wherein the distortion phase shifter and attenuator and error amplifier are adapted so as to reduce the magnitude of the pilot tone in the output of the output combiner.

19. A balanced amplifier as defined in claim 16, wherein the pilot signal is isolated from the main output.

20. A balance amplifier as defined in claim 16, wherein the pilot signal is a tone.

21. A balanced amplifier as defined in claim 16, wherein the pilot signal is derived from the input signal.

22. A balanced amplifier as defined in claim 16, wherein the pilot signal is a noise signal.

23. A balanced amplifier as defined in claim 16, wherein the pilot signal is a CDMA signal.

* * * * *